US012575415B2

(12) United States Patent
Ziadeh et al.

(10) Patent No.: US 12,575,415 B2
(45) Date of Patent: Mar. 10, 2026

(54) KEEP OUT ZONE WITH HYDROPHOBIC SURFACE FOR INTEGRATED CIRCUIT (IC) PACKAGE

(71) Applicant: SK Hynix NAND Product Solutions Corp., Rancho Cordova, CA (US)

(72) Inventors: Bassam Ziadeh, Gilbert, AZ (US); Joseph Van Nausdle, Chandler, AZ (US); Zhou Yang, Chandler, AZ (US); William J. Lambert, Tempe, AZ (US); Mitul Modi, Phoenix, AZ (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 1046 days.

(21) Appl. No.: 16/752,457

(22) Filed: Jan. 24, 2020

(65) Prior Publication Data

US 2021/0233867 A1      Jul. 29, 2021

(51) Int. Cl.
| | |
|---|---|
| *H01L 23/538* | (2006.01) |
| *H01L 21/50* | (2006.01) |
| *H01L 23/00* | (2006.01) |
| *H01L 25/065* | (2023.01) |

(52) U.S. Cl.
CPC ............ *H01L 23/562* (2013.01); *H01L 21/50* (2013.01); *H01L 23/5385* (2013.01); *H01L 23/5386* (2013.01); *H01L 24/14* (2013.01); *H01L 25/0657* (2013.01)

(58) Field of Classification Search
CPC ... H01L 23/562; H01L 23/3128; H01L 24/14; H01L 21/563; H01L 2924/15151
See application file for complete search history.

(56) References Cited

U.S. PATENT DOCUMENTS

| | | | | |
|---|---|---|---|---|
| 7,279,792 B2 * | 10/2007 | Naya | ..................... | H01L 23/544 |
| | | | | 438/609 |
| 8,597,982 B2 * | 12/2013 | Foote | ................ | H01L 23/49894 |
| | | | | 438/115 |
| 10,217,649 B2 * | 2/2019 | Lai | ......................... | H01L 21/481 |
| 10,586,716 B2 * | 3/2020 | Lu | ......................... | H01L 21/563 |
| 2013/0203219 A1 * | 8/2013 | Park | ......................... | H01L 23/13 |
| | | | | 438/126 |
| 2014/0048934 A1 * | 2/2014 | Chen | ..................... | H01L 21/563 |
| | | | | 257/738 |
| 2015/0173177 A1 * | 6/2015 | Nagar | ................... | H01L 21/563 |
| | | | | 361/760 |
| 2019/0103361 A1 * | 4/2019 | Raorane | .............. | H01L 23/3114 |

* cited by examiner

*Primary Examiner* — Phat X Cao
(74) *Attorney, Agent, or Firm* — HG LAW LLP

(57) ABSTRACT

Embodiments herein describe techniques for an IC package including a supporting layer having a first zone and a second zone. An electronic component is placed above the first zone of the supporting layer. An underfill material is formed above the first zone of the supporting layer, around or below the electronic component to support the electronic component. The second zone of the supporting layer includes a base area and multiple micro-pillars above the base area, where any two micro-pillars of the multiple micro-pillars are separated by a gap in between. The second zone has a hydrophobic surface including surfaces of the multiple micro-pillars and surfaces of the base area. The second zone is a keep out zone to prevent the underfill material from entering the second zone. Other embodiments may be described and/or claimed.

19 Claims, 7 Drawing Sheets

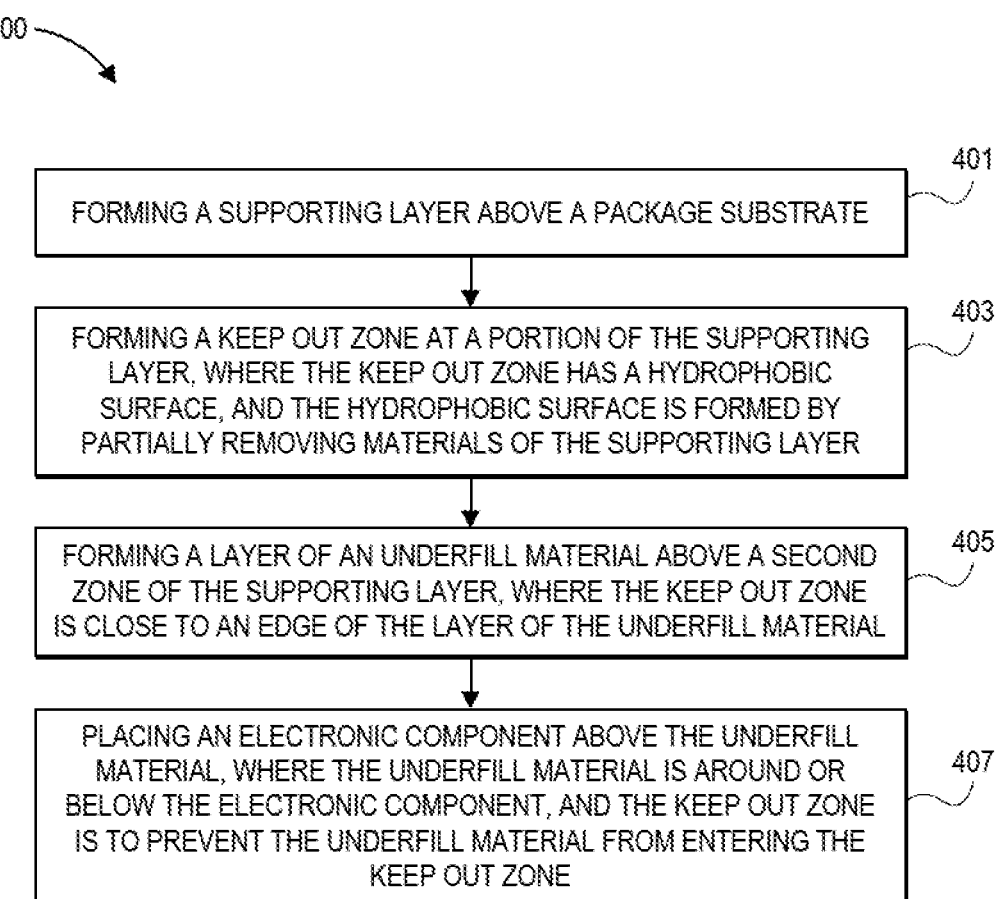

400

401
FORMING A SUPPORTING LAYER ABOVE A PACKAGE SUBSTRATE

403
FORMING A KEEP OUT ZONE AT A PORTION OF THE SUPPORTING LAYER, WHERE THE KEEP OUT ZONE HAS A HYDROPHOBIC SURFACE, AND THE HYDROPHOBIC SURFACE IS FORMED BY PARTIALLY REMOVING MATERIALS OF THE SUPPORTING LAYER

405
FORMING A LAYER OF AN UNDERFILL MATERIAL ABOVE A SECOND ZONE OF THE SUPPORTING LAYER, WHERE THE KEEP OUT ZONE IS CLOSE TO AN EDGE OF THE LAYER OF THE UNDERFILL MATERIAL

407
PLACING AN ELECTRONIC COMPONENT ABOVE THE UNDERFILL MATERIAL, WHERE THE UNDERFILL MATERIAL IS AROUND OR BELOW THE ELECTRONIC COMPONENT, AND THE KEEP OUT ZONE IS TO PREVENT THE UNDERFILL MATERIAL FROM ENTERING THE KEEP OUT ZONE

KEEP OUT ZONE WITH HYDROPHOBIC SURFACE FOR INTEGRATED CIRCUIT (IC) PACKAGE

FIELD

Embodiments of the present disclosure generally relate to the field of integrated circuit (IC), and more particularly, to IC packages.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

An electronic component, e.g., an integrated circuit (IC) chip or a die, may be coupled with other electronic components using an IC package that can be attached to a printed circuit board (PCB). Sometimes, two electronic components within an IC package may be separated by a keep out zone. IC packages are used in consumer electronics and mobile communications devices that play an essential role in current everyday life. Various packing technologies, e.g., stacked IC packages, complex system-in-packages (SiPs), and more, have been developed. However, it is a still a challenge to meet reduced product form factor targeted sizes while increasing the level of integration for heterogeneous electronic components in an IC package.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 4 schematically illustrates a process for forming an IC package including a supporting layer having a keep out zone with a hydrophobic surface, in accordance with various embodiments.

DETAILED DESCRIPTION

Figures 1A, 1B, 1C:
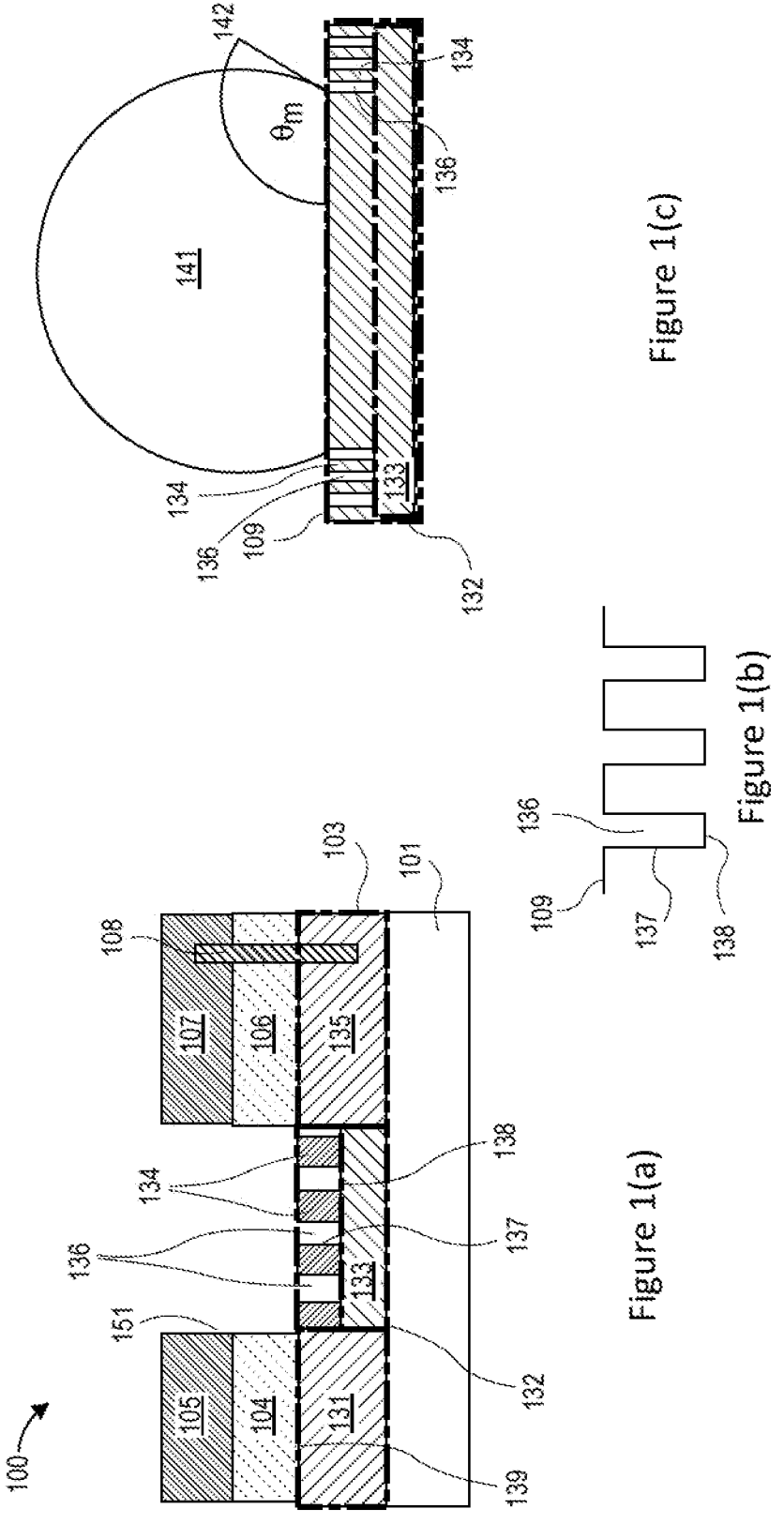
FIGS. 1(a)-1(e) schematically illustrate an example integrated circuit (IC) package including a supporting layer having a keep out zone with a hydrophobic surface, in accordance with various embodiments.

An integrated circuit (IC) package may include one or more electronic components, e.g., an IC chip or a die, placed on a package substrate, which may be further attached to a printed circuit board (PCB). An IC package, or simply a package, may include various layers, e.g., a metal or conductive layer, a mold layer, a core layer, an underfill layer, a solder resist layer, a dielectric layer, or other layers, above the package substrate. Any of those layers may be referred to as a supporting layer for electronic components within the package. A keep out zone (KOZ) may exist between two electronic components within a package to prevent unwanted material spreading from around one electronic component onto other electronic component locations. For example, a KOZ may prevent epoxy and mold underfill from spreading onto other electronic components. In addition, a KOZ may be formed to control the flow direction to prevent epoxy material from flowing past a die edge or up the sidewall of the die to prevent epoxy on die, hence improving the reliability of the package and enabling thin die applications, e.g. silicon photonics.

There are many challenges to meet reduced product form factor targeted sizes while increasing the level of integration for heterogeneous electronic components in an IC package. For example, when placing power delivery devices close enough to a die edge for optimal performance, distance or geometry constraints, e.g., a minimal distance, may exist between the power delivery devices and the die to prevent epoxy and mold underfill from spreading onto the die.

Currently there may be two primary options used to prevent the unwanted material, e.g., epoxy and mold underfill, from spreading. One approach is to form a trench on a supporting layer, e.g., solder resist trenches on a solder resist layer, by fully removing portions of the supporting layer. However, such trenches are not suitable for packages with surface layer routing, e.g., graphics products. In addition, it is difficult to change or modify the trenches since they are formed offsite at the substrate manufacturing mask layer. Another approach is to use a barrier layer on top of the supporting layer, where the barrier layer may be generated by an additive process of printing ink to create a physical wall on the supporting layer, e.g., a solder resist layer. However, such a barrier layer is generally wide and thick, hence not scalable for very fine features or in applications that cannot tolerate the nominal thickness increase due to the barrier layer.

Embodiments herein may reduce or prevent epoxy and mold underfill from spreading by creating a surface of the supporting layer that controls and corrects material flow into a preferred direction. A KOZ at selected areas of a supporting layer may have a hydrophobic surface to act as an energy barrier to prevent materials, e.g., epoxy and mold underfill, from unwanted spreading. In some embodiments, a KOZ with a hydrophobic surface may be formed by applying precise dosage of laser energy or ultra-fast laser technology to create microscopic features on the supporting layer that would resist flow of epoxy or similar materials. For example, a map indicating KOZ locations may first be created for a package, and then laser energy may be applied to generate the KOZs based on the map, where the KOZs may create resistance to epoxy or similar material so that epoxy may flow to a path of lower resistance to enable the geometric or placement benefits.

In embodiments, a KOZ with a hydrophobic surface may have reduced size compared to normal KOZ to achieve the objective of preventing materials from unwanted spreading. Hence, two electronic components may be placed closer to each other, enabling smaller product form factors for the resulting IC package. As a result, tight KOZs may be created around highly dense packages with reduced impact to package cost when compared to a barrier layer on top of the supporting layer, or reduced impact to package thickness or routing layers when compared to using trenches in the supporting layer. In addition, KOZs with hydrophobic surfaces are expected to improve manufacturing tolerance, product form factor, electrical performance, product cost, or other measurements. Furthermore, generation of KOZs with hydrophobic surfaces is inherently scalable and highly customizable to respond on individual products, hence tailored for yield and product performance.

Embodiments herein may present an IC package including a supporting layer including a first zone and a second zone. An electronic component is placed above the first zone of the supporting layer. An underfill material is formed above the first zone of the supporting layer, around or below the electronic component to support the electronic component. The second zone of the supporting layer includes a base area and multiple micro-pillars above the base area, where any two micro-pillars of the multiple micro-pillars are separated by a gap in between. The second zone has a hydrophobic surface including surfaces of the multiple micro-pillars and surfaces of the base area. The second zone is a keep out zone to prevent the underfill material from entering the second zone.

In embodiments, a method for forming an IC package is presented. The method includes forming a supporting layer above a package substrate, and forming a keep out zone at a portion of the support layer. The keep out zone has a hydrophobic surface including surfaces of multiple micro-pillars above a base area and surfaces of the base area. The multiple micro-pillars are formed by partially removing materials of the supporting layer above the base area at the keep out zone to form gaps between every two micro-pillars of the multiple micro-pillars.

Embodiments herein may present a computing device, which may include a PCB, and an IC package attached to the PCB. The IC package includes a supporting layer having a first zone and a second zone. A layer of underfill material is above the first zone of the supporting layer. An electronic component is above the first zone of the supporting layer and also above the layer of underfill material. The underfill material is around or below the electronic component to support the electronic component. The second zone of the supporting layer includes a base area and multiple micro-pillars above the base area. Two micro-pillars of the multiple micro-pillars are separated by a gap in between. The second zone has a hydrophobic surface including surfaces of the multiple micro-pillars and surfaces of the base area. The second zone is a keep out zone to prevent the underfill material from entering the second zone.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature. Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, group II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesqui-oxane, siloxane, or organosilicate glass. The ILD layers may include pores or air gaps to further reduce their dielectric constant.

Figure 1D:
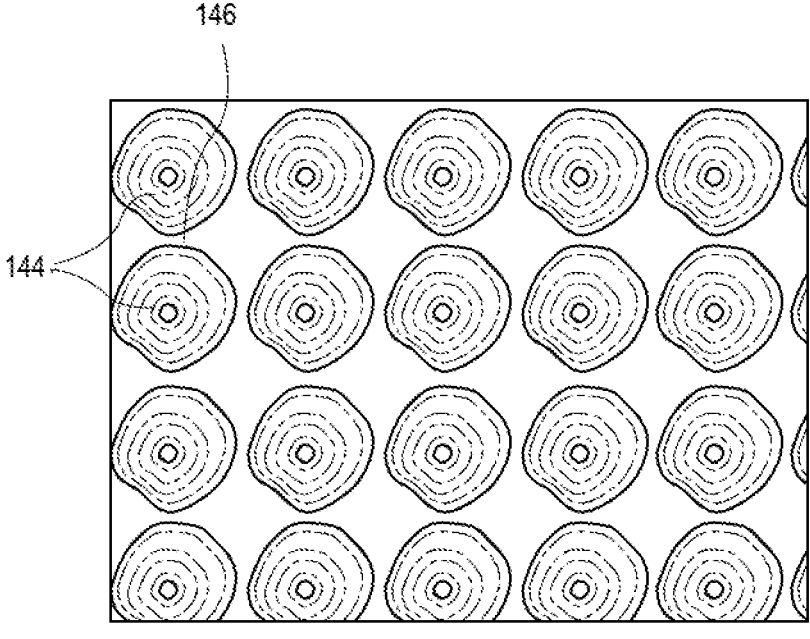
Figure 1E:
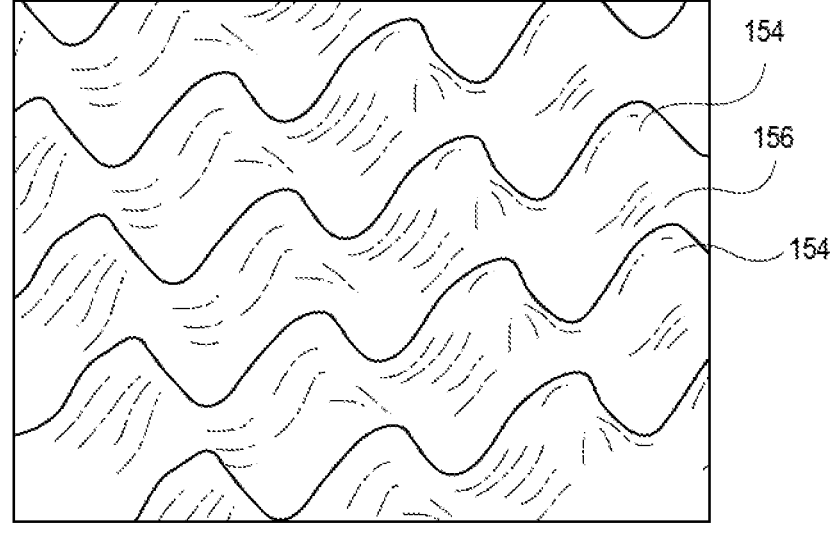

FIGS. 1(a)-1(e) schematically illustrate an example IC package 100 including a supporting layer 103 having a KOZ 132 with a hydrophobic surface 109, in accordance with various embodiments. FIG. 1(a) shows the IC package 100 including the supporting layer 103 having the KOZ 132 including multiple micro-pillars, e.g., a micro-pillar 134, above a base area 133 at the supporting layer 103. As shown in FIG. 1(b), the keep out zone 132 has a hydrophobic surface 109 including surfaces 137 of the multiple micro-pillars and surfaces 138 of the base area 133. FIGS. 1(c)-1(e) illustrate more details of various multiple micro-pillars.

In embodiments, as shown in FIG. 1(a), the IC package 100 includes a package substrate 101 and the supporting layer 103 above the package substrate 101. The supporting layer 103 includes a first zone 131, the KOZ 132 as a second zone, and a third zone 135, where the KOZ 132 is between the first zone 131 and the third zone 135. In some embodiments, the first zone 131 or the third zone 135 may have a flat or substantially flat surface 139. An underfill material 104 is above the first zone 131 of the supporting layer 103 to form an underfill layer, and an underfill material 106 is above the third zone 135 of the supporting layer 103 to form an underfill layer. An electronic component 105 is above the first zone 131, and the underfill material 104 is around or below the electronic component 105 to support the electronic component 105. An electronic component 107 is above the third zone 135, and the underfill material 106 is around or below the electronic component 107 to support the electronic component 107. The KOZ 132 is a keep out zone to prevent the underfill material 104 or the underfill material 106 from entering the KOZ 132. In some embodiments, the KOZ 132 is vertically next to an edge 151 of the electronic component 105, and next to an edge of the underfill material 104, while the underfill material 104 is completely kept out of the KOZ 132. In some other embodiments, the underfill material 104 may extend slightly into the KOZ 132, which may be caused by the processing variations. The IC package 100 may further include some other components, e.g., a through via 108, or other components not shown.

In embodiments, the KOZ 132 includes the base area 133 and multiple micro-pillars, e.g., the micro-pillar 134, above the base area 133. Two micro-pillars of the multiple micro-pillars are separated by a gap 136 in between. The gap 136 is formed by partially removing materials of the supporting layer 103 above the base area 133 at the KOZ 132. The gap 136 between the two micro-pillars has a width in a range of about 10 micrometers (um) to about 100 um, and a micro-pillar 134 of the multiple micro-pillars has a height in about 1 um to 20 um.

As shown in FIG. 1(b), the KOZ 132 has a hydrophobic surface 109 including surfaces 137 of the multiple micro-pillars, e.g., the micro-pillar 134, and surfaces 138 of the base area 133. The hydrophobic surface 109 of the KOZ 132 is different from a barrier layer on top of the supporting layer 103 generated by an additive process of printing ink on the supporting layer 103. In addition, the hydrophobic surface 109 is different from a trench in the supporting layer 103, which would complete cut the supporting layer 103 into discontinuous pieces without the connection at the base 133. The gap 136 is not a trench since the gap 136 is only partially through the supporting layer 103 instead of completely through the supporting layer 103, as a trench would do.

In embodiments, the hydrophobic surface 109 of the KOZ 132, e.g., the surfaces 137 of the multiple micro-pillars, e.g., the micro-pillar 134, and the surfaces 138 of the base area 133, may prevent the underfill material 104 or the underfill material 106 from entering the KOZ 132. As shown in FIG. 1(c), if an element 141 of an underfill material is in contact with a micro-pillar 134 of the hydrophobic surface 109, due to the surfaces 137 of the micro-pillar 134 and the gap 136, the element 141 would not spread over a tangent line 142. Hence, the hydrophobic surface 109 of the KOZ 132 can reduce or stop the spreading of an underfill material.

In embodiments, a micro-pillar of the multiple micro-pillars may be of various shapes, e.g., of a triangle shape, a half circle shape, a circular shape, an elliptical shape, a square, a rectangle shape, or a polygon comprising three or more sides. For example, as shown in FIG. 1(d), a micro-pillar 144 may be of a triangle shape in cross section view. Additionally, as shown in FIG. 1(e), a micro-pillar 154 may be of a half circle shape in cross section view.

In embodiments, a gap between the two micro-pillars may be of a triangle shape, a half circle shape, a circular shape, an elliptical shape, a square, a rectangle shape, or a polygon comprising three or more sides. For example, as shown in FIG. 1(d), a gap 146 may be of a triangle shape in cross section view. Additionally, as shown in FIG. 1(e), a gap 156 may be of a half circle shape in cross section view.

In embodiments, an electronic component, e.g., the electronic component 105 or the electronic component 107 may include a capacitor, an mmWave antenna module, a central processing unit (CPU), a graphic processing unit (GPU), a memory chip, a phase-locked loop (PLL) chip, an input/output (I/O) interface chip, an application specific integrated circuit, a field-programmable gate array, a high-bandwidth memory, a package-embedded memory, a random access memory, a flash memory, an embedded nonvolatile memory, a graphics card, a group III-V die, an accelerator, a capacitor, a passive component, an inductor, or an active component.

For example, the electronic component 105 may be a die side capacitor, and the KOZ 132 may define a capacitor to die spacing. Due to the hydrophobic surface 109 of the KOZ 132, the size of the KOZ 132 may be much smaller than a normal KOZ, e.g., like 50% to 10% of a normal KOZ, resulting in close distance between the die and the capacitor. Die side power deliver capacitors are most effective when placed very close to the die, because close placement results in the lowest VCC-VSS loop inductance that has a major impact to capacitor effectiveness at high frequencies. In addition, the small size of the KOZ 132 also reduces the overall form factor of the IC package 100. Reduced sizes of the IC package 100 are very important for low-cost products. Embodiments herein ensure underfill material can be used without sacrificing package size or electrical performance. Other applications may include that a larger size capacitor can be included in the IC package 100 because the reduced size of the KOZ 132. In some cases, it may be desirable to use a larger capacitor size (for example, very limited options for low z-height capacitors are available in the 0201 footprint). The reduced size of the KOZ 132 may help the IC package 100 to meet form-factor constrained products. For example, when the IC package 100 is a mmWave antenna modules, the pitch between antennas, and hence the overall package size, is fixed by the electrical wavelength at the RF frequency of operation, and the reduced size of the KOZ 132 may satisfy the pitch requirement for the mmWave antenna modules.

In some embodiments, the IC package 100 may be a chip scale package (CSP), a wafer-level package (WLP), a stacked IC package, a system-in-package (SiP), a multi-chip package (WCP), a quad-flat no-leads (QFN) package, a dual-flat no-leads (DFN) package, a flip chip package, or a ball grid array (BGA) package. The supporting layer 103 may include a solder resist layer, a metal layer, a mold layer, a core layer, a dielectric layer, an insulated polymer layer, or a silicon substrate. In embodiments, the supporting layer 103 may include organic resin, inorganic filler, or a conductive material. Additionally and alternatively, the supporting layer 103 may include an epoxy with fillers such as silica and with glass fiber weave made out of silica. The supporting layer 103 may further include many material layers in itself. For example, the supporting layer 103 may be a combination of the various dielectric materials including buildup material that is also made out of epoxy with silica or magnesia fillers.

In embodiments, the underfill material 104 or the underfill material 106 may include epoxy resin, acrylates, bismale-imides, polyesters, polyimides, polyolefins, polystyrene, polyurethanes, polyurethane resin, silicone resin, or polyes-ter resin, silica, alumina, boron nitride, zinc oxide, a filler material, colorants, inhibitors, ion trappers, stress absorbers, polymers, surfactants, binding agents, fluxing agents, or additives. The package substrate 101 may include a poly-meric substrate, a non-polymeric substrate, a silicon sub-strate, a silicon on insulator (SOI) substrate, a silicon on sapphire (SOS) substrate.

In embodiments, the IC package 100 may be a part of wearable device or a mobile computing device. In addition, not shown, the wearable device or the mobile computing device may include one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

FIGS. 2(a)-2(e) schematically illustrate in cross section view example IC packages, e.g., an IC package 200, an IC package 210, an IC package 220, an IC package 230, an IC package 240, including a supporting layer having a keep out zone with a hydrophobic surface, in accordance with various embodiments. The IC package 200, the IC package 210, the IC package 220, the IC package 230, and the IC package 240 may be an example of the IC package 100 as shown in FIG. 1(a).

Figures 2A, 2B, 2C, 2D, 2E:
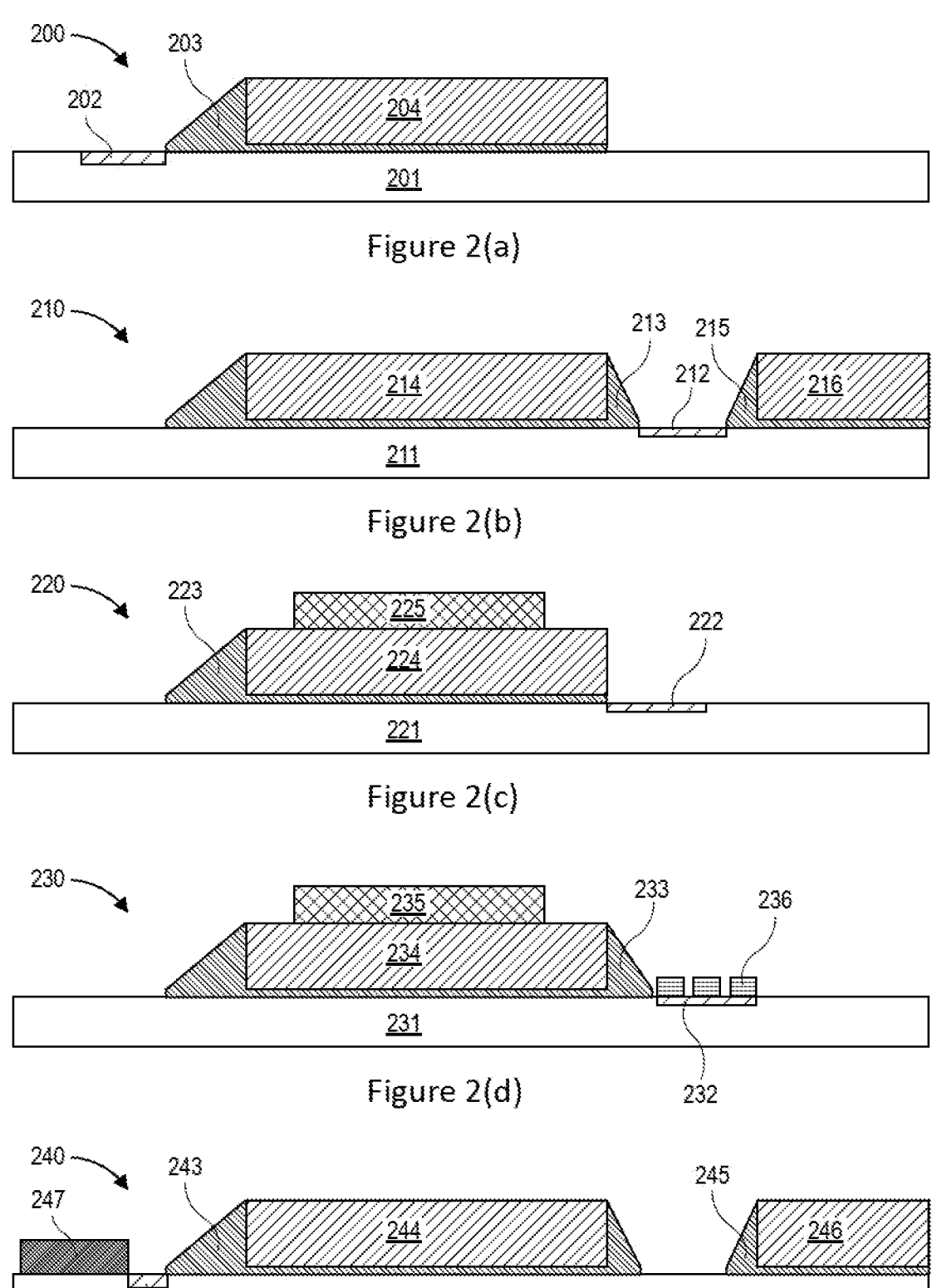
FIGS. 2(a)-2(e) schematically illustrate in cross section view example IC packages including a supporting layer having a keep out zone with a hydrophobic surface, in accordance with various embodiments.

In embodiments, as shown in FIG. 2(a), the IC package 200 includes a supporting layer 201 having a KOZ 202 with a hydrophobic surface (not shown). An underfill material 203 is above a first zone of the supporting layer 201 to form an underfill layer, an electronic component 204 is above the first zone of the supporting layer 201, and the underfill material 203 is around or below the electronic component 204 to support the electronic component 204. The hydro-phobic surface of KOZ 202 is to keep the underfill material 203 out of the KOZ 202.

In embodiments, as shown in FIG. 2(b), the IC package 210 includes a supporting layer 211 having a KOZ 212 with a hydrophobic surface (not shown). An underfill material 213 is above a first zone of the supporting layer 211 to form an underfill layer, an electronic component 214 is above the first zone of the supporting layer 211, and the underfill material 213 is around or below the electronic component 214 to support the electronic component 214. In addition, an underfill material 215 is above a second zone of the sup-porting layer 211 to form an underfill layer, an electronic component 216 is above the second zone of the supporting layer 211, and the underfill material 215 is around or below the electronic component 216 to support the electronic component 216. The KOZ 212 is between the first zone and the second zone of the supporting layer 211 to keep the underfill material 213 and the underfill material 215 from merging or creating a continuous interface.

In embodiments, as shown in FIG. 2(c), the IC package 220 includes a supporting layer 221 having a KOZ 222 with a hydrophobic surface (not shown). An underfill material 223 is above a first zone of the supporting layer 221 to form an underfill layer, an electronic component 224 is above the first zone of the supporting layer 221, and the underfill material 223 is around or below the electronic component 224 to support the electronic component 224. In addition, an electronic component 225 is above the electronic component 224. The hydrophobic surface of KOZ 222 is to keep the underfill material 223 from rolling up die edge and creating a fillet.

In embodiments, as shown in FIG. 2(d), the IC package 230 includes a supporting layer 231 having a KOZ 232 with a hydrophobic surface (not shown). An underfill material 233 is above a first zone of the supporting layer 231 to form an underfill layer, an electronic component 234 is above the first zone of the supporting layer 231, and the underfill material 233 is around and below the electronic component 234 to support the electronic component 234. In addition, an electronic component 235 is above the electronic component 234. Furthermore, a layer of second material 236 is above the KOZ 232, where the second material 236 is different from the underfill material 233. For example, the second material 236 above the KOZ 232 includes a passive material, a lid, a metal stiffener, or an underfill for a different electronic component. The hydrophobic surface of KOZ 232 is to keep the underfill material 233 from coming in contact with the second material above the KOZ 232.

In embodiments, as shown in FIG. 2(e), the IC package 240 includes a supporting layer 241 having a KOZ 242 with a hydrophobic surface (not shown). An underfill material 243 is above a first zone of the supporting layer 241 to form an underfill layer, an electronic component 244 is above the first zone of the supporting layer 241, and the underfill material 243 is around and below the electronic component 244 to support the electronic component 244. In addition, an underfill material 245 is above a second zone of the sup-porting layer 241 to form an underfill layer, an electronic component 246 is above the second zone of the supporting layer 241, and the underfill material 245 is around or below the electronic component 246 to support the electronic component 246. Furthermore, a packaging component 247, e.g., a stiffener adhesive, is above a third zone of the supporting layer 241, and the KOZ 242 is between the first zone and the third zone of the supporting layer 241. The hydrophobic surface of KOZ 242 is to keep the stiffener adhesive from spreading to remainder of IC package 240.

Figure 3:
FIG. 3 schematically illustrates in top down view an example IC package having various keep out zones with a hydrophobic surface, in accordance with various embodiments.

FIG. 3 schematically illustrates in top down view an example IC package 300 having various keep out zones with a hydrophobic surface, e.g., a KOZ A, a KOZ B, a KOZ C, and a KOZ D, in accordance with various embodiments. The KOZ A, the KOZ B, the KOZ C, and the KOZ D may be similar to the KOZ 132 as shown in FIG. 1(a), or the KOZ 202, the KOZ 212, the KOZ 222, the KOZ 232, the KOZ 242, as shown in FIGS. 2(a)-2(e).

In embodiments, the KOZ A is located around an edge of a die 301, in a shape of a diagonal line. The KOZ A can reduce the needed distance from an edge of the die 301 to an edge of the IC package 300 since the KOZ A can stop the spreading of underfill materials from under the die 301 to the edge of the IC package 300. The KOZ B is located around an edge of a die 302, in a shape of L, to reduce needed distance from die side components to die edge. The KOZ C is formed in straight-line shape between two dissimilar dies to allow dissimilar materials to be used under the two dissimilar dies, since KOZ C would stop them from being merged. The KOZ D is formed in straight-line shape near the die edge to be an edge fillet, as shown in FIG. 2(c), which does not extend past the die edge to allow silicon edge access for a silicon photonics fiber component to be attached in the IC package 300.

FIG. 4 schematically illustrates a process 400 for forming an IC package including a supporting layer having a keep out zone with a hydrophobic surface, in accordance with various embodiments. In embodiments, the process 400 may be applied to form the KOZ 132 as shown in FIG. 1(a), the KOZ 202, the KOZ 212, the KOZ 222, the KOZ 232, the KOZ 242, as shown in FIGS. 2(a)-2(e), or the KOZ A, the KOZ B, the KOZ C, or the KOZ D as shown in FIG. 3.

At block 401, the process 400 may include forming a supporting layer above a package substrate. For example, as shown in FIG. 1(a), the process 400 may be applied to form the supporting layer 103 above the package substrate 101.

At block 403, the process 400 may include forming a keep out zone at a portion of the supporting layer, where the keep out zone has a hydrophobic surface, and the hydrophobic surface is formed by partially removing materials of the supporting layer. For example, as shown in FIG. 1(a), the process 400 may include forming the KOZ 132 at a portion of the supporting layer 103, where the keep out zone 132 has a hydrophobic surface 109, and the hydrophobic surface 109 is formed by partially removing materials of the supporting layer 103. The hydrophobic surface 109 includes surfaces 137 of the multiple micro-pillars, e.g., the micro-pillar 134, and surfaces 138 of the base area 133. The multiple micro-pillars are formed by partially removing materials of the supporting layer 103 using a laser with an electromagnetic pulse whose time duration is of an order of a picosecond ($10^{-12}$ second) or less, and with pulse energy in a range of about 0.1 mJ to about 1.5 mJ.

At block 405, the process 400 may include forming a layer of an underfill material above a second zone of the supporting layer, where the keep out zone is close to an edge of the layer of the underfill material. For example, as shown in FIG. 1(a), the process 400 may include forming the underfill material 104 above the zone 131 of the supporting layer 103, where the KOZ 132 is close to an edge of the layer of the underfill material 104.

At block 407, the process 400 may include placing an electronic component above the underfill material, where the underfill material is around or below the electronic component, and the keep out zone is to prevent the underfill material from entering the keep out zone. For example, as shown in FIG. 1(a), the process 400 may include placing the electronic component 105 above the underfill material 104, where the underfill material 104 is around or below the electronic component 105, and the KOZ 132 is to prevent the underfill material 104 from entering the keep out zone 132.

Figure 5:
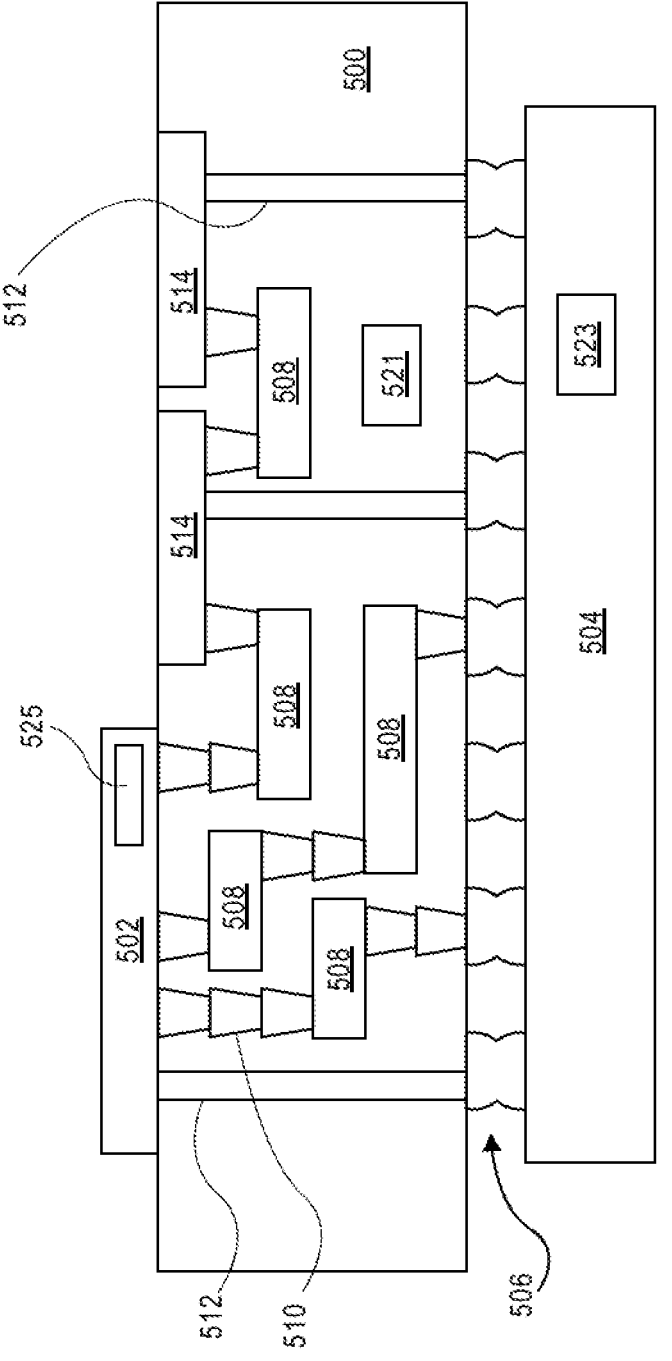
FIG. 5 schematically illustrates a package substrate implementing one or more embodiments of the disclosure, in accordance with various embodiments.

FIG. 5 schematically illustrates a package substrate 500 implementing one or more embodiments of the disclosure, in accordance with some embodiments. The package substrate 500 is an intervening substrate used to bridge a first substrate 502 to a second substrate 504. The first substrate 502 may be, for instance, a substrate support for a die. The second substrate 504 may be, for instance, a memory module, a computer motherboard, or a PCB. For example, a package substrate 500 may couple an integrated circuit die to a ball grid array (BGA) 506 that can subsequently be coupled to the second substrate 504. In some embodiments, the first and second substrates 502/504 are attached to opposing sides of the package substrate 500. In other embodiments, the first and second substrates 502/504 are attached to the same side of the package substrate 500. And in further embodiments, three or more substrates are interconnected by way of the package substrate 500.

The package substrate 500 may be formed of an epoxy resin, a fiberglass-reinforced epoxy resin, a ceramic material, or a polymer material such as polyimide. In further implementations, the package substrate may be formed of alternate rigid or flexible materials that may include the same materials described above for use in a semiconductor substrate, such as silicon, germanium, and other group III-V and group IV materials.

The package substrate may include metal interconnects 508 and vias 510, including but not limited to through-silicon vias (TSVs) 512. In embodiments, the package substrate 500 may include a supporting layer having a KOZ 521 with a hydrophobic surface, the first substrate 502 may include a supporting layer having a KOZ 525 with a hydrophobic surface, and the second substrate 504 may include a supporting layer having a KOZ 523 with a hydrophobic surface. The KOZ 521, the KOZ 525, and the KOZ 523, may be an example of the KOZ 132 as shown in FIG. 1(a), the KOZ 202, the KOZ 212, the KOZ 222, the KOZ 232, the KOZ 242, as shown in FIGS. 2(a)-2(e), or the KOZ A, the KOZ B, the KOZ C, or the KOZ D as shown in FIG. 3. The package substrate 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the package substrate 500.

In accordance with embodiments of the disclosure, apparatuses or processes disclosed herein may be used in the fabrication of package substrate 500.

Figure 6:
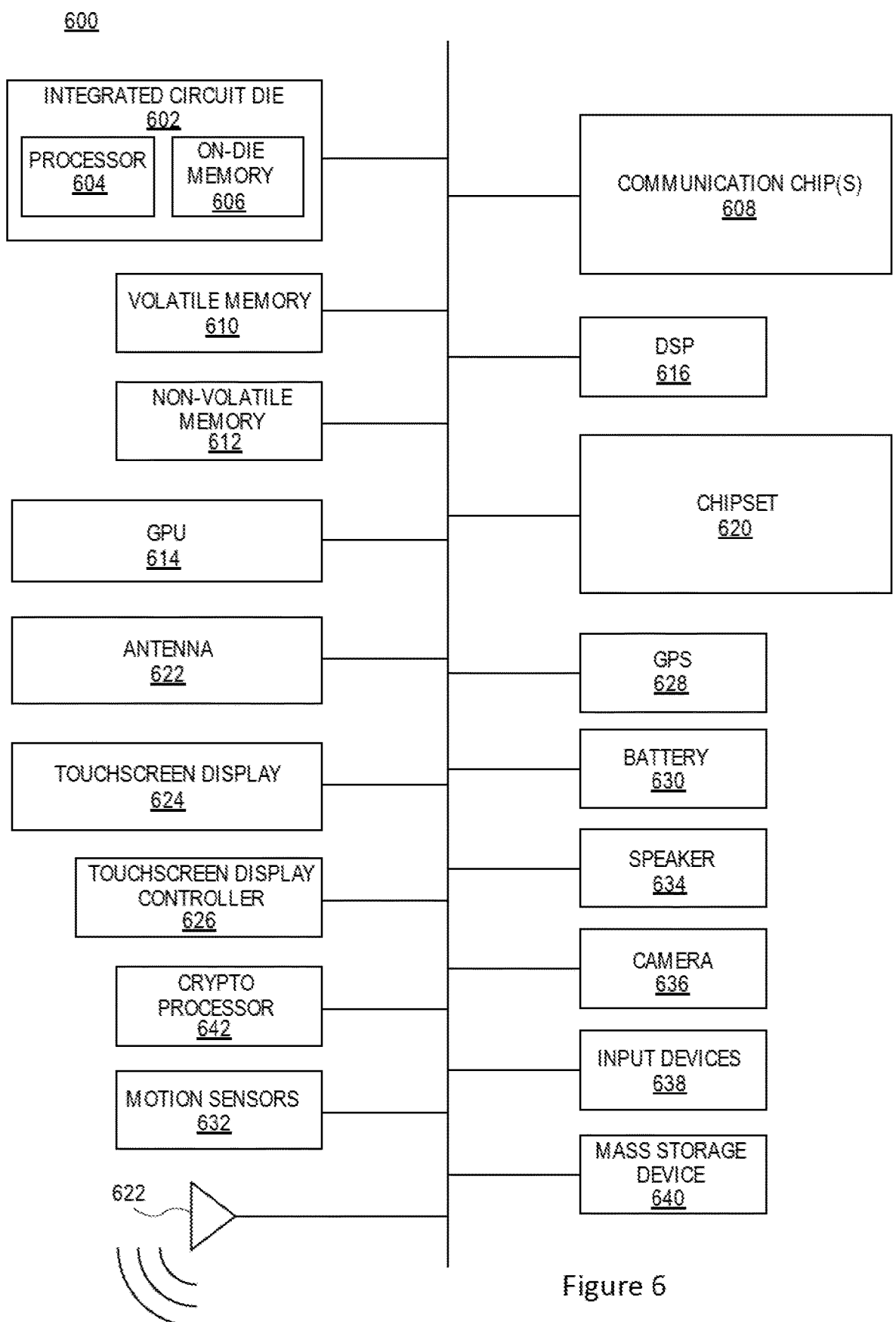
FIG. 6 schematically illustrates a computing device built in accordance with an embodiment of the disclosure, in accordance with various embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606, the processor 604, or the integrated circuit die 602 may be placed on a packaging substrate that includes a supporting layer having a KOZ with a hydrophobic surface, and the KOZ may be an example of the KOZ 132 as shown in FIG. 1(a), the KOZ 202, the KOZ 212, the KOZ 222, the KOZ 232, the KOZ 242, as shown in FIGS. 2(a)-2(e), or the KOZ A, the KOZ B, the KOZ C, or the KOZ D as shown in FIG. 3. In embodiments, the computing device 600 may include a display or a touchscreen display 624, and a touchscreen display controller 626. A display or the touchscreen display 624 may include a FPD, an AMOLED display, a TFT LCD, a micro light-emitting diode (uLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure. In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include an integrated circuit (IC) package, comprising: a supporting layer including a first zone and a second zone; an electronic component above the first zone of the supporting layer; and an underfill material above the first zone of the supporting layer, around or below the electronic component to support the electronic component; wherein the second zone of the supporting layer includes a base area and multiple micro-pillars above the base area, wherein two micro-pillars of the multiple micro-pillars are separated by a gap in between, and the second zone has a hydrophobic surface including surfaces of the multiple micro-pillars and surfaces of the base area, and wherein the second zone is a keep out zone to prevent the underfill material from entering the second zone.

Example 2 may include the IC package of example 1 and/or some other examples herein, wherein the underfill material is completely kept out of the second zone.

Example 3 may include the IC package of example 1 and/or some other examples herein, wherein the supporting layer includes a solder resist layer, a metal layer, a mold layer, a core layer, a dielectric layer, an insulated polymer layer, or a silicon substrate. Example 4 may include the IC package of example 1 and/or some other examples herein, wherein the first zone of the supporting layer has a flat surface.

Example 5 may include the IC package of example 1 and/or some other examples herein, wherein the electronic component is a first electronic component, and the IC package further includes a second electronic component above a third zone of the supporting layer, and the second zone is between the first zone and the third zone.

Example 6 may include the IC package of example 1 and/or some other examples herein, wherein the second zone is vertically next to an edge of the electronic component.

Example 7 may include the IC package of example 1 and/or some other examples herein, wherein the gap between the two micro-pillars has a width in a range of about 10 micrometers (um) to about 100 um, and a micro-pillar of the multiple micro-pillars has a height in about 1 um to 20 um.

Example 8 may include the IC package of example 1 and/or some other examples herein, wherein a micro-pillar of the multiple micro-pillars is of a triangle shape, a half circle shape, a circular shape, an elliptical shape, a square, a rectangle shape, or a polygon comprising three or more sides; and the gap between the two micro-pillars is of a triangle shape, a half circle shape, a circular shape, an elliptical shape, a square, a rectangle shape, or a polygon comprising three or more sides.

Example 9 may include the IC package of example 1 and/or some other examples herein, wherein the IC package is a chip scale package (CSP), a wafer-level package (WLP), a stacked IC package, a system-in-package (SiP), a multi-chip package (WCP), a quad-flat no-leads (QFN) package, a dual-flat no-leads (DFN) package, a flip chip package, or a ball grid array (BGA) package.

Example 10 may include the IC package of example 1 and/or some other examples herein, wherein the electronic component includes a capacitor, an mmWave antenna module, a central processing unit (CPU), a graphic processing unit (GPU), a memory chip, a phase-locked loop (PLL) chip, an input/output (I/O) interface chip, an application specific integrated circuit, a field-programmable gate array, a high-bandwidth memory, a package-embedded memory, a random access memory, a flash memory, an embedded non-volatile memory, a graphics card, a group III-V die, an accelerator, a capacitor, a passive component, an inductor, or an active component.

Example 11 may include the IC package of example 1 and/or some other examples herein, wherein the underfill material includes epoxy resin, acrylates, bismaleimides, polyesters, polyimides, polyolefins, polystyrene, polyurethanes, polyurethane resin, silicone resin, or polyester resin, silica, alumina, boron nitride, zinc oxide, a filler material, colorants, inhibitors, ion trappers, stress absorbers, polymers, surfactants, binding agents, fluxing agents, or additives.

Example 12 may include the IC package of example 1 and/or some other examples herein, wherein the IC package further includes a layer of second material above the second zone, wherein the second material is different from the underfill material.

Example 13 may include the IC package of example 12 and/or some other examples herein, wherein the second material above the second zone includes a passive material, a lid, a metal stiffener, or an underfill for a different electronic component.

Example 14 may include the IC package of example 1 and/or some other examples herein, wherein the IC package further includes a package substrate below the supporting layer, and wherein the package substrate includes a polymeric substrate, a non-polymeric substrate, a silicon substrate, a silicon on insulator (SOI) substrate, a silicon on sapphire (SOS) substrate.

Example 15 may include a method for forming an integrated circuit (IC) package, the method comprising: forming a supporting layer above a package substrate; and forming a keep out zone at a portion of the supporting layer, wherein the keep out zone has a hydrophobic surface including surfaces of multiple micro-pillars above a base area and surfaces of the base area, wherein the multiple micro-pillars are formed by partially removing materials of the supporting layer above the base area at the keep out zone to form gaps between any two micro-pillars of the multiple micro-pillars.

Example 16 may include the method of example 15 and/or some other examples herein, wherein the multiple micro-pillars are formed by partially removing materials of the supporting layer using a laser with an electromagnetic pulse whose time duration is of an order of a picosecond (10-12 second) or less, and with pulse energy in a range of about 0.1 mJ to about 1.5 mJ.

Example 17 may include the method of example 15 and/or some other examples herein, wherein the keep out zone is a first zone, and the method further comprises: forming a layer of an underfill material above a second zone of the supporting layer, wherein the keep out zone is close to an edge of the layer of the underfill material; and placing an electronic component above the layer of the underfill material, wherein the layer of the underfill material is around or below the electronic component to support the electronic component, and the keep out zone is to prevent the underfill material from entering the keep out zone.

Example 18 may include the method of example 17 and/or some other examples herein, wherein the electronic component is a first electronic component, and the method further comprises: placing a second electronic component above a third zone of the supporting layer, and the keep out zone is between the second zone and the third zone.

Example 19 may include the method of example 17 and/or some other examples herein, further comprising: forming a layer of second material above the keep out zone, wherein the second material is different from the underfill material.

Example 20 may include the method of example 15 and/or some other examples herein, wherein the supporting layer includes a solder resist layer, a metal layer, a mold layer, a core layer, a dielectric layer, an insulated polymer layer, or a silicon substrate, and wherein the gap between the two micro-pillars has a width in a range of about 10 micrometers (um) to about 100 um, and a micro-pillar of the multiple micro-pillars has a height in about 1 um to 20 um.

Example 21 may include a computing device, comprising: a printed circuit board (PCB); and an integrated circuit (IC) package attached to the PCB, wherein the IC package includes: a supporting layer including a first zone and a second zone; a layer of underfill material above the first zone of the supporting layer; an electronic component above the first zone of the supporting layer and also above the layer of underfill material, wherein the layer of underfill material is around or below the electronic component to support the electronic component; and wherein the second zone of the supporting layer includes a base area and multiple micro-pillars above the base area, wherein two micro-pillars of the multiple micro-pillars are separated by a gap in between, and the second zone has a hydrophobic surface including surfaces of the multiple micro-pillars and surfaces of the base area, and wherein the second zone is a keep out zone to prevent the underfill material from entering the second zone.

Example 22 may include the computing device of example 21 and/or some other examples herein, wherein the underfill material includes epoxy resin, acrylates, bismaleimides, polyesters, polyimides, polyolefins, polystyrene, polyurethanes, polyurethane resin, silicone resin, or polyester resin, silica, alumina, boron nitride, zinc oxide, a filler material, colorants, inhibitors, ion trappers, stress absorbers, polymers, surfactants, binding agents, fluxing agents, or additives.

Example 23 may include the computing device of example 21 and/or some other examples herein, wherein the electronic component includes a capacitor, an mmWave antenna module, a central processing unit (CPU), a graphic processing unit (GPU), a memory chip, a phase-locked loop (PLL) chip, an input/output (I/O) interface chip, an application specific integrated circuit, a field-programmable gate array, a high-bandwidth memory, a package-embedded memory, a random access memory, a flash memory, an embedded nonvolatile memory, a graphics card, a group III-V die, an accelerator, a capacitor, a passive component, an inductor, or an active component.

Example 24 may include the computing device of example 21 and/or some other examples herein, wherein the gap between the two micro-pillars has a width in a range of about 10 micrometers (um) to about 100 um, and a micro-pillar of the multiple micro-pillars has a height in about 1 um to 20 um.

Example 25 may include the computing device of example 21 and/or some other examples herein, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) package, comprising:
a supporting layer comprising a first zone, a second zone, and a third zone, the first zone comprising a first portion adjacent to a first side of the second zone, and the first zone comprising a second portion adjacent to a second side of the second zone, the second side laterally opposite the first side, wherein the second zone is intervening between the first portion of the first zone and the second portion of the first zone;

a first electronic component above the first portion of the first zone of the supporting layer, and a second electronic component above the second portion of the first zone of the supporting layer; and an underfill material above the first zone of the supporting layer, around or below the first electronic component and the second electronic component;

wherein the second zone of the supporting layer comprises a base area and multiple micro-pillars above the base area, the micro-pillars comprising an uppermost surface at a same level as an uppermost surface of the first zone of the supporting layer, wherein two micro-pillars of the multiple micro-pillars are separated by a gap therebetween, and the second zone has a hydrophobic surface comprising surfaces of the multiple micro-pillars and surfaces of the base area, wherein the third zone comprises a hydrophobic surface, and wherein the third zone is a keep out zone in a shape of a diagonal line around an edge of at least one of the first electronic component or the second electronic component to prevent the underfill material from entering the third zone.

2. The IC package of claim 1, wherein the underfill material is completely kept out of the second zone.

3. The IC package of claim 1, wherein the supporting layer comprises one or more of a solder resist layer, a metal layer, a mold layer, a core layer, a dielectric layer, an insulated polymer layer, or a silicon substrate.

4. The IC package of claim 1, wherein the first zone of the supporting layer has a flat surface.

5. The IC package of claim 1, wherein the second zone is vertically next to an edge of the first electronic component.

6. The IC package of claim 1, wherein the gap between the two micro-pillars has a width in a range of about 10 micrometers (um) to about 100 um, and a micro-pillar of the multiple micro-pillars has a height in a range of about 1 um to about 20 um.

7. The IC package of claim 1, wherein:
a micro-pillar of the multiple micro-pillars is of a triangle shape, a half circle shape, a circular shape, an elliptical shape, a square, a rectangle shape, or a polygon comprising three or more sides; and
the gap between the two micro-pillars is of a triangle shape, a half circle shape, a circular shape, an elliptical shape, a square, a rectangle shape, or a polygon comprising three or more sides.

8. The IC package of claim 1, wherein the IC package is one of a chip scale package (CSP), a wafer-level package (WLP), a stacked IC package, a system-in-package (SiP), a multi-chip package (WCP), a quad-flat no-leads (QFN) package, a dual-flat no-leads (DFN) package, a flip chip package, or a ball grid array (BGA) package.

9. The IC package of claim 1, wherein the first electronic component or the second electronic component comprises one or more of a capacitor, an mmWave antenna module, a central processing unit (CPU), a graphic processing unit (GPU), a memory chip, a phase-locked loop (PLL) chip, an input/output (I/O) interface chip, an application specific integrated circuit, a field-programmable gate array, a high-bandwidth memory, a package-embedded memory, a random access memory, a flash memory, an embedded nonvolatile memory, a graphics card, a group III-V die, an accelerator, a capacitor, a passive component, an inductor, or an active component.

10. The IC package of claim 1, wherein the underfill material comprises one or more of epoxy resin, acrylates, bismaleimides, polyesters, polyimides, polyolefins, polystyrene, polyurethanes, polyurethane resin, silicone resin, polyester resin, silica, alumina, boron nitride, zinc oxide, a filler material, colorants, inhibitors, ion trappers, stress absorbers, polymers, surfactants, binding agents, fluxing agents, or additives.

11. The IC package of claim 1, wherein the IC package further includes a layer of second material above the second zone, wherein the second material is different from the underfill material.

12. The IC package of claim 11, wherein the second material above the second zone includes a passive material, a lid, a metal stiffener, or an underfill for a different electronic component.

13. The IC package of claim 1, wherein the IC package further comprises a package substrate below the supporting layer, and wherein the package substrate comprises one or more of a polymeric substrate, a non-polymeric substrate, a silicon substrate, a silicon on insulator (SOI) substrate, or a silicon on sapphire (SOS) substrate.

14. The IC package of claim 1, further comprising another electronic component and another keep out zone, the another keep out zone being in a shape of an L around two edges of the another electronic component.

15. A computing device, comprising:

a printed circuit board (PCB); and an integrated circuit (IC) package attached to the PCB, wherein the IC package comprises:

a supporting layer comprising a first zone, a second zone, and a third zone, the first zone comprising a first portion adjacent to a first side of the second zone, and the first zone comprising a second portion adjacent to a second side of the second zone, the second side laterally opposite the first side, wherein the second zone is intervening between the first portion of the first zone and the second portion of the first zone;

a layer of underfill material above the first zone of the supporting layer;

a first electronic component above the first portion of the first zone of the supporting layer, and a second electronic component above the second portion of the first zone of the supporting layer, wherein the layer of underfill material is around or below the first electronic component and the second electronic component; and wherein the second zone of the supporting layer comprises a base area and multiple micro-pillars above the base area, the micro-pillars comprising an uppermost surface at a same level as an uppermost surface of the first zone of the supporting layer, wherein two micro-pillars of the multiple micro-pillars are separated by a gap therebetween, and the second zone has a hydrophobic surface comprising surfaces of the multiple micro-pillars and surfaces of the base area, wherein the third zone comprises a hydrophobic surface, and wherein the third zone is a keep out zone in a shape of a diagonal line around an edge of at least one of the first electronic component or the second electronic component to prevent the underfill material from entering the third zone.

16. The computing device of claim 15, wherein the underfill material comprises one or more of epoxy resin, acrylates, bismaleimides, polyesters, polyimides, polyolefins, polystyrene, polyurethanes, polyurethane resin, silicone resin, polyester resin, silica, alumina, boron nitride, zinc oxide, a filler material, colorants, inhibitors, ion trappers, stress absorbers, polymers, surfactants, binding agents, fluxing agents, or additives.

17. The computing device of claim 15, wherein the first electronic component or the second electronic component comprises one or more of a capacitor, an mmWave antenna module, a central processing unit (CPU), a graphic processing unit (GPU), a memory chip, a phase-locked loop (PLL) chip, an input/output (I/O) interface chip, an application specific integrated circuit, a field-programmable gate array, a high-bandwidth memory, a package-embedded memory, a random access memory, a flash memory, an embedded nonvolatile memory, a graphics card, a group III-V die, an accelerator, a capacitor, a passive component, an inductor, or an active component.

18. The computing device of claim 15, wherein the gap between the two micro-pillars has a width in a range of about 10 micrometers (um) to about 100 um, and a micro-pillar of the multiple micro-pillars has a height in a range of about 1 um to about 20 um.

19. The computing device of claim 15, wherein the computing device comprises a device selected from the group consisting of a wearable device or a mobile computing device, the wearable device or the mobile computing device comprising one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *